US012690179B2

(12) United States Patent
Böhm

(10) Patent No.: US 12,690,179 B2
(45) Date of Patent: Jul. 21, 2026

(54) METHOD FOR ENSURING THE ELECTRICAL SHIELDING OF A DEVICE HOUSING

(71) Applicant: PONTIS EMC GmbH, Schwarzenfeld (DE)

(72) Inventor: Erich Böhm, Amberg (DE)

(73) Assignee: PONTIS EMC GmbH, Schwarzenfeld (DE)

( * ) Notice: Subject to any disclaimer, the term of this patent is extended or adjusted under 35 U.S.C. 154(b) by 77 days.

(21) Appl. No.: 18/927,067

(22) Filed: Oct. 25, 2024

(65) Prior Publication Data

US 2025/0194063 A1    Jun. 12, 2025

(30) Foreign Application Priority Data

Dec. 6, 2023    (DE) .......................... 102023134138.3

(51) Int. Cl.
   *H05K 9/00*        (2006.01)
(52) U.S. Cl.
   CPC ......... *H05K 9/0007* (2013.01); *H05K 9/0049* (2013.01)
(58) Field of Classification Search
   CPC ................................................... H05K 9/0049
   See application file for complete search history.

(56) References Cited

U.S. PATENT DOCUMENTS

| | | | | |
|---|---|---|---|---|
| 8,569,621 B1 * | 10/2013 | Shotey | ..................... | H02G 3/14 |
| | | | | 174/67 |
| 10,587,067 B2 * | 3/2020 | Lager | .................. | H01R 13/447 |

| | | | | |
|---|---|---|---|---|
| 11,764,558 B2 * | 9/2023 | Williamson | ............. | H02G 3/12 |
| | | | | 174/66 |
| 12,040,601 B2 * | 7/2024 | Fisher | ..................... | H02G 3/121 |
| 2020/0068752 A1 * | 2/2020 | Badihi | ..................... | C09D 7/61 |
| 2025/0213738 A1 * | 7/2025 | Zhan | ......................... | A61L 2/08 |

FOREIGN PATENT DOCUMENTS

| | | |
|---|---|---|
| CN | 209777168 U | 12/2019 |
| DE | 4405408 C1 | 5/1995 |
| DE | 19830127 A1 | 1/2000 |
| DE | 10141390 A1 | 3/2003 |
| EP | 1249681 A2 | 10/2002 |
| FR | 1518147 A | 3/1968 |

\* cited by examiner

*Primary Examiner* — Hung V Ngo
(74) *Attorney, Agent, or Firm* — Welsh Flaxman & Gitler LLC

(57)        ABSTRACT

A method is provided for ensuring the electrical shielding of a device housing during processing. The device housing comprises a hollow profile that is closed on the front side by a housing cover. Both the hollow profile and the housing cover are electrically conductive. The housing cover comprises an annular extension that encompasses a thinned section at the end of the hollow profile, wherein the height (h) of the annular extension is less than the height (H) of the thinned section, so that the front side of the thinned section contacts the cover interior, and a distance (a) remains between the free end of the annular extension and a ledge at the beginning of the thinned section. A processing cover is used for processing the device housing and also comprises an annular extension, wherein the height (h2) of the annular extension of the processing cover is greater than the height (H) of the thinned section so that, during painting, the extension adjoins the ledge at the beginning of the thinned section of the hollow profile.

12 Claims, 2 Drawing Sheets

METHOD FOR ENSURING THE ELECTRICAL SHIELDING OF A DEVICE HOUSING

BACKGROUND OF THE INVENTION

1. Field of the Invention

The present invention relates to a method for ensuring the electrical shielding of a device housing during processing, in particular during painting.

2. Description of the Related Art

During operation, electronic assemblies and electrical circuits of devices typically radiate electromagnetic waves which are intended to be reliably insulated by the device housing. Primarily, there exist areas of application in which radiation via the devices used in this context is absolutely undesirable, for example, in measuring devices used for electromagnetic compatibility (EMC). For this reason, device housings made of an electrically conductive material are used in devices used in this context, so the devices are basically arranged in a Faraday cage which contains radiation. The housing usually is comprised of metal, usually aluminum.

One critical radiation leakage region exists at connection points where the various parts of the housing are assembled.

In such radiation-sensitive applications, the housing usually comprises a hollow profile and a housing cover. The connecting edge between these two housing components is one potential location for radiation leakage, in particular in the region where the housing cover adjoins the front side of the hollow profile. Even a small distance at this edge can result in radiation leakage. Therefore, a variety of concepts exist for preventing radiation leakage at these locations, such as the use of many fastening screws so that the distance between the housing cover and the free end of the hollow profile remains smaller than one-quarter of the wavelength of the radiation being contained. Alternatively or additionally, an electrically conductive seal can be inserted between the housing cover and the hollow profile. Finally, an overlap of the contact surface of the housing cover is envisioned, so that the contact surface between the housing cover and the hollow profile is as large as possible. This is possible if, for example, the housing cover comprises an annular extension that encompasses the interior or exterior of the front side of the hollow cylinder.

SUMMARY OF THE INVENTION

According to the invention, a solution is used in which the front side region of the hollow profile (usually an extrusion or cast profile) comprises a thinned section which extends over a certain length of the hollow profile. The annular extension of the housing cover that forms the cover edge then encompasses this thinned section of the hollow profile. The contact surface between the housing cover and the hollow profile is thus located in the overlapping region between the annular extension and the thinned section of the hollow profile. A second contact surface is formed on the front side of the hollow profile and contacts the cover interior, which is ensured by the height of the annular extension being no more than (preferably less than) the height of the thinned section. As a result, a distance remains between the free end of the annular extension and the ledge formed at the beginning of the thinned section. This distance ensures that the front side of the hollow profile can adjoin the cover interior. In this way, two consecutively connected contact surfaces are formed, whereby radiation passage through the housing can be prevented in a very efficient manner.

A processing cover is used to also ensure this electrical contact during processing of the device housing, in particular during painting. This processing cover comprises an annular extension in the same manner as the normal housing cover and is, in a processing position, intended to encompass and closely adjoin the thinned section of the hollow profile. However, in contrast to the housing cover, the height of the annular extension of the processing cover is greater than the height of the thinned section, so that the annular extension adjoins the ledge during painting, said ledge being formed at the beginning of the thinned section, i.e., at the transition between the normal wall of the hollow profile and the thinned section. In this way, all contact surfaces of the hollow profile are protected by the processing cover during processing, in particular during painting, and their contact capability is therefore not impaired (e.g., by paint mist) during processing of the hollow profile. After processing, the processing cover is removed again, and the housing cover is connected to the finished (in particular painted or passivated) hollow profile.

The thinned section is preferably produced by means of milling from the exterior of the hollow profile, so that highly defined external dimensions (i.e., distances between the exterior sides facing away from one another from the thinned section) are achieved on the opposing walls of the hollow profile, which results in the annular extension of the precisely processed housing cover then also contacting and adjoining the contact surface on the outer circumference of the thinned section, thereby achieving reliable shielding of the first contact surface.

The height of the annular extension of the processing cover is preferably greater than the height of the thinned section so that, in the processing position, the processing cover is at a distance from the free end of the thinned section of the hollow profile. As a result, the free end of the thinned section of the hollow profile, which free end forms the second contact surface with the cover interior, is not contaminated by the processing cover.

Preferably, aluminum is used as the material for the hollow profile and the housing cover, and the method is used when painting, passivating, or anodizing the housing. The electrical conductivity of the contact surfaces of the hollow profile is most likely to be impaired during these processing steps, so the method according to the invention can be effectively applied in that context.

A cast profile or an extrusion profile is preferably used as a hollow profile for the device housing, which profile in particular features a rectangular (in particular square) or round cross-section. Profiles of this kind are technically straightforward, producible in large quantities, and easily ablated from the exterior in order to form the thinned section. The hollow profile can also be closed on a front side, thereby forming a pot-shaped profile which only requires one housing cover. Two housing covers are usually required to close a continuously open hollow profile.

The electrical connection between the hollow profile and the housing cover is preferably provided by mechanical contact between the exterior of the thinned section and the interior of the annular extension of the housing cover, thereby forming the first contact surface, as well as being provided between the cover interior of the housing cover and the free end of the thinned section of the hollow profile, thereby forming the second contact surface. The two contact surfaces are in this way connected in a consecutive manner, thus quite effectively preventing any scattered radiation from passing through the edge between the housing cover and the hollow profile.

The invention further relates to a device housing, in particular for devices comprising electrical or electronic assemblies which emit a certain degree of radiation. The device housing comprises a hollow profile that is closed on the front side by at least one housing cover, whereby both the hollow profile and the housing cover are electrically conductive. The hollow profile can, e.g., also be a pot-shaped profile that is closed on one side by a single housing cover, or it can be open on both sides such that both ends are closed by one housing cover.

For example, the housing cover, or rather one of the housing covers, can also comprise a recess for the passage of lines, or for a camera lens when a camera is arranged in the housing. The hollow profile and the housing cover preferably is comprised of metal, in particular aluminum. The housing cover comprises an annular extension acting as a cover edge which projects from a cover side and encompasses a thinned section at the end of the hollow profile. The height of the annular extension is in this case no greater than (in particular smaller) than the height of the thinned section, so that the front side of this thinned section adjoins the cover interior and forms the second contact surface in that location. The first contact surface is formed by the close contact between the interior of the annular extension of the housing cover and the exterior of the thinned portion.

This device housing will have been processed by a processing method described hereinabove such that the contact surfaces between the hollow profile and the housing cover were not affected during processing.

If the case of a device housing consisting of aluminum, one preferred processing is the anodization of the housing in particular.

The invention also relates to a camera, which is arranged in a device housing explained hereinabove.

The invention also relates to a set comprising a device housing for devices, which comprise electrical or electronic components, and a processing cover, the device housing comprising a hollow profile closed on the front side by at least one housing cover. Both the hollow profile and the housing cover are electrically conductive. The hollow profile can be a continuously open hollow profile, or it can be closed on one side and thereby form a pot-shaped hollow profile. The housing cover comprises an annular extension that projects toward a cover side, which basically forms the cover edge. This annular extension encompasses a thinned section at the end of the hollow profile. The thinning is in this case performed from the outside of the housing wall of the hollow profile such that the interior of the annular extension closely adjoins the exterior of the thinned section in a contacting manner. The selected height of the annular extension is no greater (in particular smaller) than the height of the thinned section, so that the front side of this thinned section adjoins the interior of the cover and forms the second contact surface in that location.

The set further contains a processing cover for use in processing, in particular when painting the hollow profile. Like the housing cover, the processing cover comprises an annular extension which, in a processing position, is intended to encompass the thinned section of the hollow profile, the height of the annular extension of the processing cover nevertheless being greater than the height of the thinned section. In this way, the free end of the annular extension of the processing cover rests upon the ledge at the beginning of the thinned section of the hollow profile. As a result, both the exterior of the thinned section forming the first contact surface and the front side of the thinned section forming the second contact surface are completely covered by the processing cover. Therefore, the conductivity of these contact surfaces is not impaired (e.g., by paint mist) during processing.

In the case of the housing cover, the height of the annular extension is preferably smaller than the height of the thinned section, so that a distance remains between the free end of the annular extension of the housing cover and the ledge at the beginning of the thinned section of the hollow profile. This ensures that the front side of the thinned section of the hollow profile can adjoin the cover interior in a contacting manner.

It is clear to the skilled person that the embodiments of the invention described hereinabove can be combined with one another in any desired manner insofar as the features of different embodiments do not contradict one another.

The following expressions are used interchangeably: device housing-housing.

BRIEF DESCRIPTION OF THE DRAWINGS

The invention will be explained hereinafter in greater detail with reference to the schematic drawings attached. Shown are.

DETAILED DESCRIPTION OF THE PREFERRED EMBODIMENTS

Figure 1:
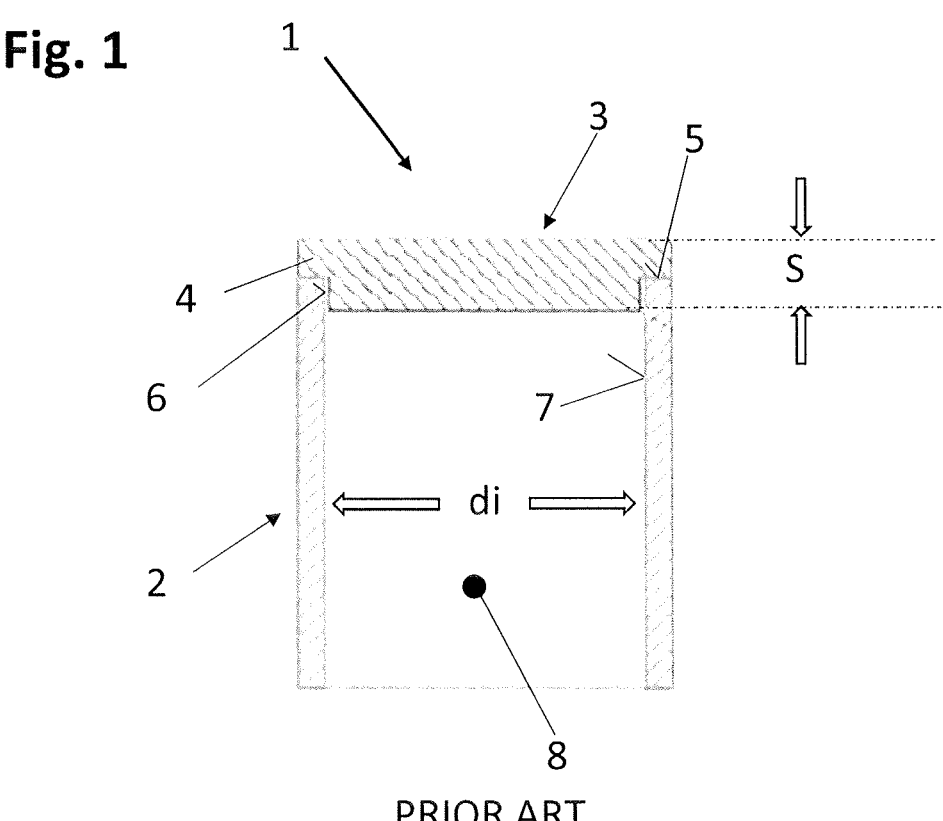
FIG. 1 a longitudinal section through a device housing comprised of a hollow profile having a front-side housing cover according to the prior art, FIG. 2 a longitudinal section through a device housing having a hollow profile and a front-side housing cover according to the present invention, FIG. 3 a detail III from FIG. 2, and FIG. 4 a longitudinal section of a device housing having a hollow profile and a processing cover for processing the hollow profile.

FIG. 1 shows a device housing 1 according to the prior art comprising a hollow profile 2, in particular made of metal, upon which a housing cover 3 made of metal is placed. The housing cover 3 has a thinned outer edge 4, which rests upon the front side 5 of the hollow profile. In another respect, a ledge 6 is formed between the housing cover region of normal thickness S and the thinned outer edge 4, which ledge extends in the axial direction of the hollow profile 2. The housing cover 3 adjoins by way of this ledge 6 and the inner wall 7 of the hollow profile 2, and forms the second electrical contact in that location.

The disadvantage of this embodiment is that, due to manufacturing tolerances, the inner diameter di of the hollow profile 12 may fluctuate, which then leads to the ledge 6 of the housing cover 3 not closely adjoining the inner wall 7 of the hollow profile 2 in a contacting manner. Only one contact surface would then remain between the thinned outer edge 4 of the housing cover 3 and the front side 5 of the hollow profile, but this contact surface can easily be impaired by contamination or during processing. This edge between the hollow profile 12 and the housing cover 14 thus easily forms a path, so that radiation is able to escape outwards from the housing interior 8.

Figure 2:
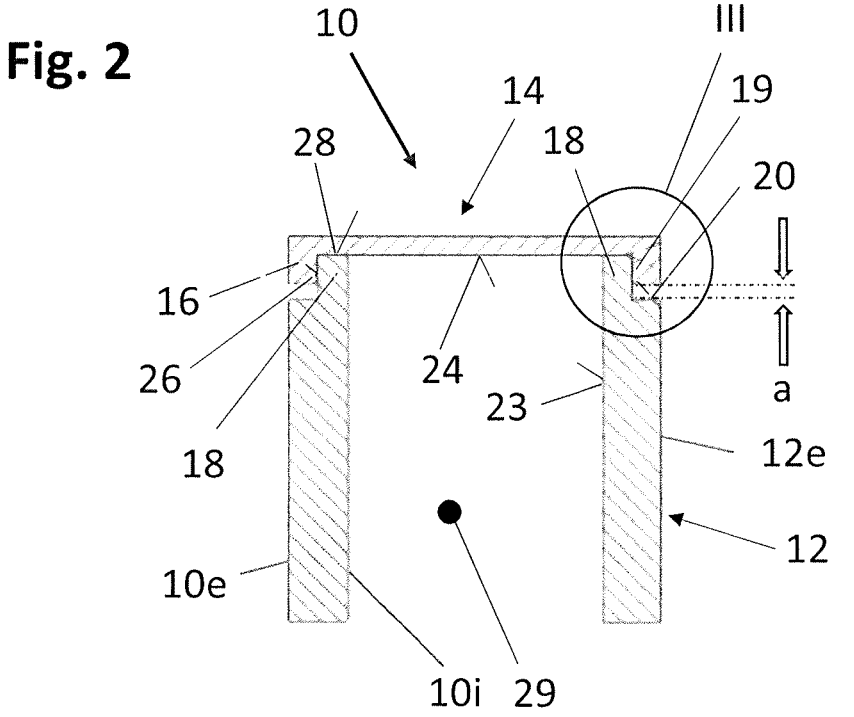
Figures 3, 4:
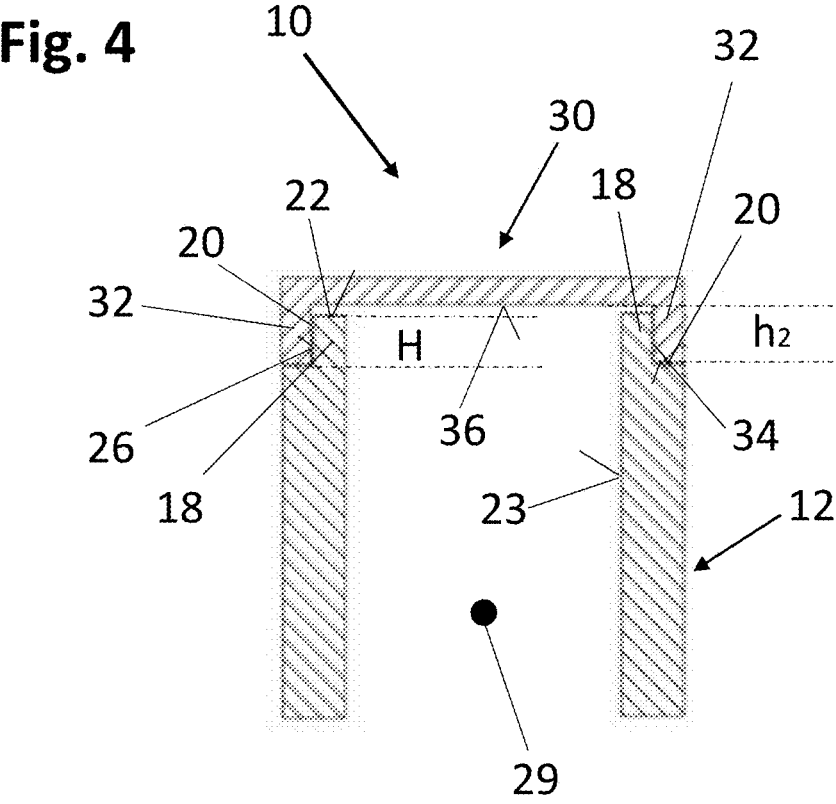

FIGS. 2 and 3 show an inventive shape of a device housing 10, which also comprises a hollow profile 12 and a housing cover 14. The device housing 10 includes an exterior surface (that is, the housing exterior) 10e and an interior surface (that is, the housing interior) 10i. The hollow profile 12 can be a cast profile or an extrusion profile, or it can be a profile manufactured in another manner. The bottom hollow profile 12 can also be closed, so that the hollow profile would be pot-shaped. In the case of the device housing 10 according to the invention, the housing cover 14 comprises an annular extension 16, which faces the hollow profile 12 and forms the cover edge. This annular extension 16 encompasses a thinned section 18 of the hollow profile 12. The thinned section 18 is thinned from the housing exterior 10e (in particular, an exterior 12e of the hollow profile 12) such that a ledge 20 extends outward between the normal housing wall (that is, the exterior surface 10e of the device housing 10) and the thinned section 18. The exterior 19 of this thinned section 18 closely adjoins and is encompassed in a contacting manner by the annular extension 16 of the housing cover 14 in an overlapping region d (FIG. 3). The height h of the annular extension 16 of the housing cover 14 is no higher than, in particular slightly smaller than, the height H of the thinned section 18. As a result, the front sides 22 of the thinned section 18 adjoin the interior 24 of the housing cover 14. As a result, a first contact surface 26 is formed in the overlapping region d between the annular extension 16 and the exterior 19 of the thinned section 18, and a second contact surface 28 is formed between the front side 22 of the thinned section 18 and the interior 24 of the housing cover 14. These two contact surfaces 26, 28 are consecutively connected, thereby effectively preventing any radiation from the interior 29 of the device housing 10 escaping outward through the edge between the hollow profile 12 and the housing cover 14. A device provided with such a device housing 10, e.g. a camera, can therefore also be used in highly radiation-sensitive areas, such as an arrangement for measuring electromagnetic sensitivity.

A processing cover 30 (as shown in FIG. 4) is used to ensure the two contact surfaces 26, 28 during processing of the hollow profile 12 of the device housing 10, e.g. during painting or passivation. In this context, it should be noted that identical elements or functionally identical elements are provided with identical reference signs in all of the drawings. The processing cover 30 comprises—in the same manner as the housing cover 14—an annular extension 32, whose height h2 (in the axial direction of the hollow profile 12) is, however, greater than the height H of the thinned section, so that the free edge 34 of the annular extension 32 rests upon the ledge 20 at the foot of the thinned section 18 of the hollow profile 12. As a result, the front side (or free end) 22 of the thinned section 18 is at a distance from the cover interior 36 of the processing cover 30. Therefore, the exterior 19 of the thinned section 18, which forms the hollow profile-side portion of the first contact surface 26, is protected by the processing cover 30 and, in another respect, the cover interior 36 of the processing cover 30 is at a distance from the free end 22 of the thinned section 18, so that this second contact surface 28 is not contaminated by the processing cover 30. Therefore, the exterior of the thinned section 18, as well as the front side thereof, are in this way effectively protected during processing of the hollow profile 12 in order to thus maintain conductivity during connection when placing the housing cover 14 upon the hollow profile 12 after processing.

It will be clear to the skilled person that the invention is not limited to the exemplary embodiment shown, but can instead be varied within the protective scope of the attached claims.

LIST OF REFERENCE SIGNS

1 Housing according to the prior art
2 Hollow profile of the device housing
3 Housing cover
4 Thinned outer edge of the housing cover
5 Front side the hollow profile
6 Ledge between the inner housing cover region and the thinned outer edge
7 Inner wall of the hollow profile
8 Housing interior
10 Device housing according to the invention
12 Hollow profile of the device housing
14 Housing cover
16 The annular extension of the housing cover forming the outer edge and extending toward the hollow profile
18 Front-side region of the thinned section of the hollow profile
19 Exterior of the thinned section
20 Ledge at the beginning of the thinned section of the hollow profile
22 Front-side end of the thinned section of the hollow profile
24 Cover interior of the housing cover
26 First contact surface between the exterior of the thinned section and the interior of the annular extension of the housing cover
28 Second contact surface between the front side of the thinned section of the hollow profile and the cover interior of the housing cover
29 Interior of the device housing
30 Processing cover for use in processing the hollow profile, in particular painting or passivation.
32 Annular extension of the processing cover forming the outer edge of the cover and extending toward the hollow profile
34 Free lower edge of the annular extension of the processing cover
36 Cover interior of the processing cover
H Height of the thinned section of the hollow profile
h Height of the annular extension of the housing cover
h2 Height of the annular extension of the processing cover
a Distance between the ledge at the beginning of the thinned section and the free end of the annular extension of the housing cover.

The invention claimed is:

1. A method for ensuring electrical shielding of a device housing during processing, which the device housing comprises a hollow profile that is closed on a front side by at least one housing cover, wherein both the hollow profile and the housing cover are electrically conductive, the method comprising:

providing the housing cover comprising, as a cover edge, an annular extension which projects from a cover side and encompasses an overlapping region (d) of a section at an end of the hollow profile, which section is thinned from an exterior, wherein a selected height (h) of the annular extension is less than the height (H) of the thinned section, adjoining the housing cover to the hollow profile such that the front side of the thinned section adjoins the cover interior in a contacting manner, and a distance (a) remains between a free end of the annular extension and a ledge at a beginning of the thinned section of the hollow profile, providing a processing cover that is used for processing the device housing and also comprises a annular extension which, in a processing position, encompasses the thinned section of the hollow profile and adjoins the thinned section of the hollow profile, wherein the selected height (h h2) of the annular extension of the processing cover is greater than the height (H) of the thinned section so that, during processing, said extension adjoins the ledge at the beginning of the thinned section of the hollow profile.

2. The method according to claim 1, wherein, in the processing position, the processing cover is at a distance from the free end of the thinned section of the hollow profile.

3. The method according to claim 1, wherein aluminum is used as a material for the hollow profile and the housing cover, and that the method is used in painting or passivation/anodization.

4. The method according to claim 1, wherein a cast profile or an extrusion profile is used as the hollow profile.

5. The method according to claim 1, wherein the thinned section is milled.

6. The method according to claim 1, wherein an electrical connection between the hollow profile and the housing cover is provided by a first contact surface between the exterior of the thinned section and the interior of the annular extension, as well as by a second contact surface between the interior of the cover and the free end of the thinned section.

7. A device housing, comprising:
   a hollow profile that is closed on the front side by at least one housing cover, wherein both the hollow profile and the housing cover are electrically conductive,
   which housing cover comprises an annular extension that projects from a cover side and encompasses a thinned section at the end of the hollow profile in a contacting manner,
   wherein the selected height (h) of the annular extension is less than the height (H) of the thinned section, so that the front side of the thinned section adjoins the cover interior in a contacting manner, for processing in a method according to claim 1.

8. The device housing according to claim 7, wherein a distance (a) remains between the free end of the annular extension and the ledge at the beginning of the thinned section of the hollow profile.

9. The device housing according to claim 7, comprising metal.

10. A camera arranged in a device housing according to claim 7.

11. A set comprising a device housing and a processing cover, which device housing comprises a hollow profile that is closed on a front side by at least one housing cover, wherein both the hollow profile and the housing cover are electrically conductive,
   which housing cover comprises an annular extension that projects from a cover side and encompasses a thinned section at an end of the hollow profile,
   wherein a selected height of the annular extension is less than the height of the thinned section, so that the front side of said thinned section adjoins the cover interior in a contacting manner, and wherein the processing cover is designed for use during processing and comprises an annular extension which is, in a processing position, intended to encompass the thinned section of the hollow profile, wherein the height (h) of the annular extension of the processing cover is greater than the height (H) of the thinned section.

12. The set according to claim 11, wherein a distance (a) remains between a free end of the annular extension and a ledge at a beginning of the thinned section of the hollow profile.

* * * * *